(12) United States Patent
Chen

(10) Patent No.: US 6,717,045 B2
(45) Date of Patent: Apr. 6, 2004

(54) PHOTOVOLTAIC ARRAY MODULE DESIGN FOR SOLAR ELECTRIC POWER GENERATION SYSTEMS

(76) Inventor: Leon L. C. Chen, 126-03 7th Ave., College Point, NY (US) 11356

( * ) Notice: Subject to any disclaimer, the term of this patent is extended or adjusted under 35 U.S.C. 154(b) by 0 days.

(21) Appl. No.: 10/047,151

(22) Filed: Oct. 23, 2001

(65) Prior Publication Data

US 2003/0075212 A1 Apr. 24, 2003

(51) Int. Cl.[7] .............................................. H01L 31/052
(52) U.S. Cl. ...................... 136/246; 136/259; 136/291; 257/432; 60/641.8; 126/683
(58) Field of Search ................. 136/246, 259, 136/291; 257/432; 60/641.8; 126/683

(56) References Cited

U.S. PATENT DOCUMENTS

| | | | |
|---|---|---|---|
| 4,003,638 A | * 1/1977 | Winston | 136/246 |
| 4,114,592 A | * 9/1978 | Winston | 136/246 |
| 4,238,246 A | * 12/1980 | Genequand et al. | 136/248 |
| 5,118,361 A | * 6/1992 | Fraas et al. | 136/246 |
| 5,505,789 A | 4/1996 | Fraas et al. | 136/246 |
| 6,299,317 B1 | * 10/2001 | Gorthala | 359/853 |
| 6,348,684 B1 | * 2/2002 | Nykolak et al. | 250/216 |
| 6,384,320 B1 | * 5/2002 | Chen | 136/259 |
| 6,440,769 B2 | * 8/2002 | Peumans et al. | 438/65 |
| 6,476,312 B1 | * 11/2002 | Barnham | 136/247 |

OTHER PUBLICATIONS

Collares–Pereira et al, "High Temperature Solar Collector of Optimal Concentration—Non–Focusing Lens with Secondary Concentrator," SUN Proceedings Int'l Solar Energy Society Congress, New Delhi, India, Jan. 1978, Pergamon Press, 1978.*

* cited by examiner

Primary Examiner—Alan Diamond
(74) Attorney, Agent, or Firm—Collard & Roe, P.C.

(57) ABSTRACT

The invention relates to a solar photovoltaic array module design, which constitutes three steps of optical concentrations of photovoltaic electric power generation systems. A compound parabolic concentrator (CPC) is mounted under a first optical concentrating fresnel lens that concentrates the intensity of sunlight to five times above normal level. Then the focused sunlight is further concentrated twenty times by the second optical concentrator CPC. The high mirror quality of CPC allows 98% of the reflected rays to be focused at the bottom of the CPC. At this point, the intensified sunlight passes through a third optical concentrator glass lens, which with anti-reflection coating on the top of the glass lens' surface, incident on the multi-junction solar cell accomplish the third optical concentration for the photovoltaic electric energy conversion.

20 Claims, 4 Drawing Sheets

PHOTOVOLTAIC ARRAY MODULE DESIGN FOR SOLAR ELECTRIC POWER GENERATION SYSTEMS

BACKGROUND OF THE INVENTION

1. Field of the Invention

This invention relates to a thin film multi-junction photovoltaic array module of solar electric power systems.

2. The Prior Art

U.S. Pat. No. 5,505,789 to Fraas et al discloses a line-focus photovoltaic module using solid optical secondaries for improved radiation resistance. This invention consists of an array of linear arched fresnel lenses with a linear photovoltaic cell receiver located along the focal line of each lens. The optical secondaries may be parabolic in shape.

These systems disclose the combination of fresnel lenses, and parabolic reflectors. U.S. patent application Ser. No. 09/687,960, now U.S. Pat. No. 6,384,320 discloses a combination of a fresnel lens, compound parabolic reflector incorporated with third optical concentration glass lenses and multi-junction solar cells for photovoltaic electric energy conversion.

SUMMARY OF THE INVENTION

The invention relates to a thin film multi-junction photovoltaic array module of solar electric power generation systems. The high performance photovoltaic (PV) array module with multi-junction concentrator solar cells converts directly 30 or 40% of received solar energy to electricity.

A photovoltaic solar cell is a semiconductor device that converts sunlight directly to electricity through the Photovoltaic Effect. One of the important developments of PV applications is the lowering of the system cost through the design of the PV array module to more efficiently convert the sunlight directly to electricity.

The PV array module contains multi-step concentrations of sunlight with Fresnel lenses, CPC reflectors and specially shaped glass lenses that can be made with much smaller surface areas of expensive multi-junction concentrator solar cells in the system. Solar high-concentration and high-efficiency multi-junction solar cells are the essential factors for lowering the cost of PV array modules which produce electricity.

To meet the requirement of ultra high efficiency, concentrator solar cells, such as tandem GaInP/GaInAs and other multi-junction concentrator solar cells such as at least three-junction solar cells, are provided to generate more than 32 or 45%.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views:

FIG. 1b shows a sunlight concentrator system of the solar photovoltaic array shown on FIG. 1a.

FIG. 2b shows a sectional view through B—B of FIG. 2a;

FIG. 3b shows a sectional view through C—C of FIG. 3a.

DETAILED DESCRIPTION OF THE PREFERRED EMBODIMENT

Figure 1A:
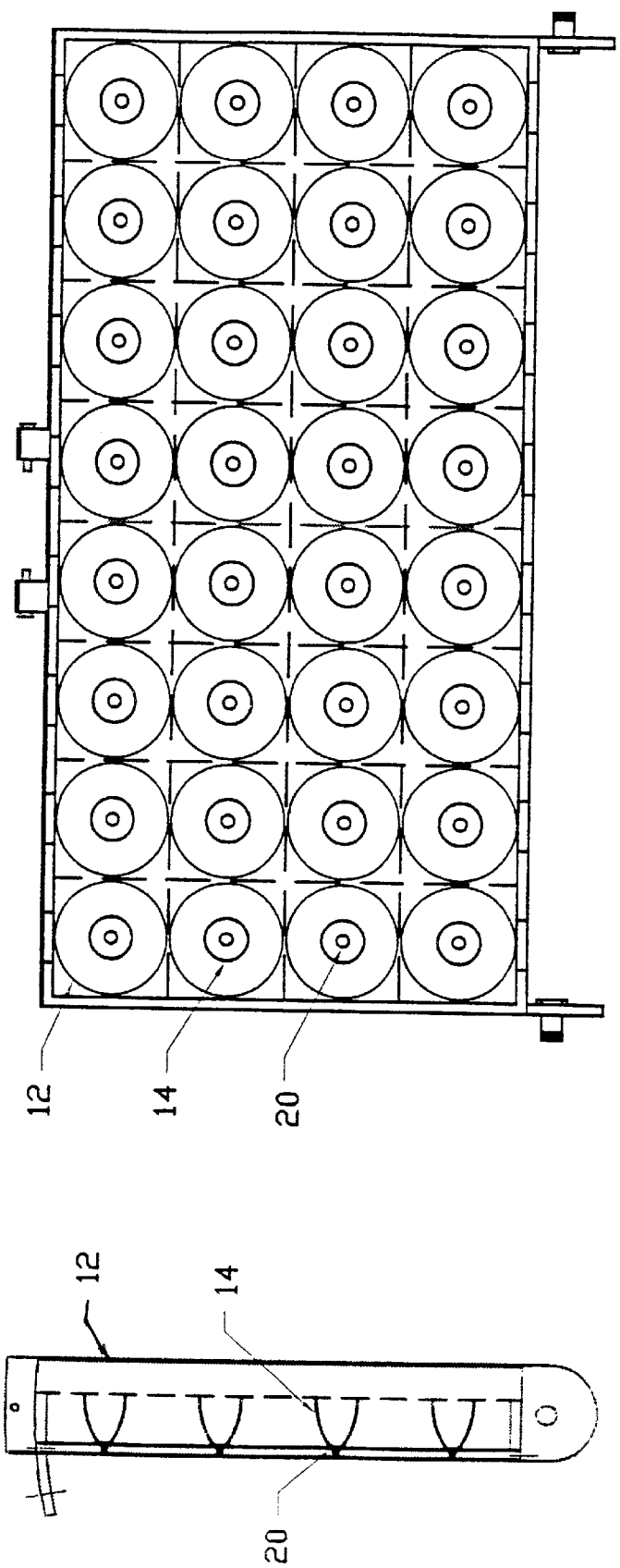
FIG. 1a shows a photovoltaic array module.
Figure 1C:
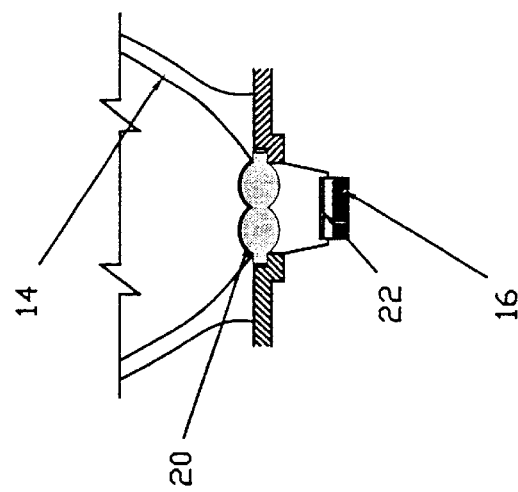
FIG. 1c shows a cross sectional view through A—A of FIG. 1b.
Figure 1B:
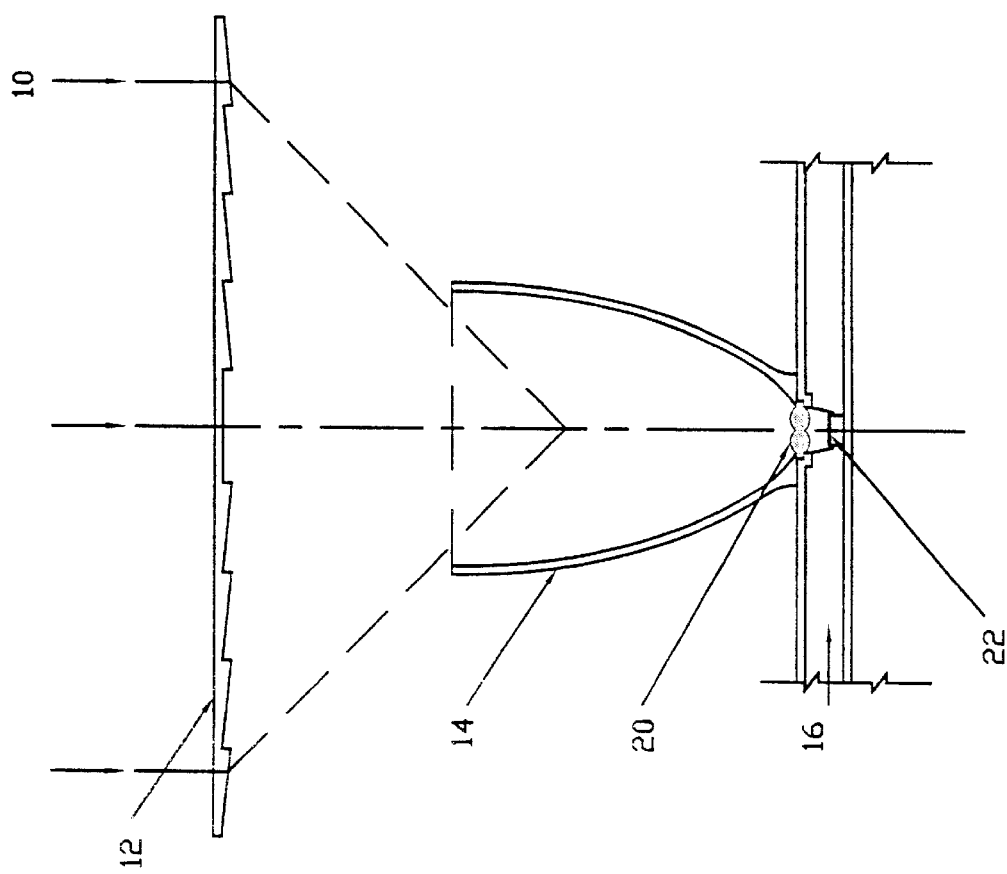

Referring to the drawings and in particular to FIGS. 1a and 1b, a sunlight concentrator 10 is shown containing first optical concentrator 12 for focusing sunrays five to ten times their normal intensity. Second optical concentrator 14 is disposed below first optical concentrator 12. Second optical concentrator 14 concentrates the focused sunrays twenty to fifty times. Third optical concentrator 20, being a specially shaped glass lens, is disposed at the bottom of second optical concentrator 14. Concentrator solar cell 22 is disposed below third optical concentrator 20. Third optical concentrator 20 focuses the rays up to 1000 times of the original solar isolation. In addition, solar cell 22 can provide a 45% conversion efficiency. Fluid flows through heat dissipater 16 and is heated by solar cells 22.

In a preferred embodiment, solar cells 22 comprise a Tandem GaInP/GaInAs or GaAs concentrator solar cells. Also in a preferred embodiment, first optical concentrator 12 is a fresnel lens and second optical concentrator 14 is a compound parabolic concentrator. Third optical concentrator 20 is an optical concentrating glass lens, having one of three different possible shapes for suitable different applications.

Second optical concentrator 14 is made of glass-mirror containing a reflective surface coating and several layers of protective materials. The reflective surface coating can also be aluminum foil or a chrome coated metal plate.

Second optical concentrator 14 can be made of a ceramic material having a glass-mirror with a silver-reflective coating covered with several layers of protective materials. The ceramic pad is used to mount second optical concentrator 14 to the concentrator structure with a special adhesive. The protective materials reduce the thermal stress at high operating temperatures.

Figure 2A:
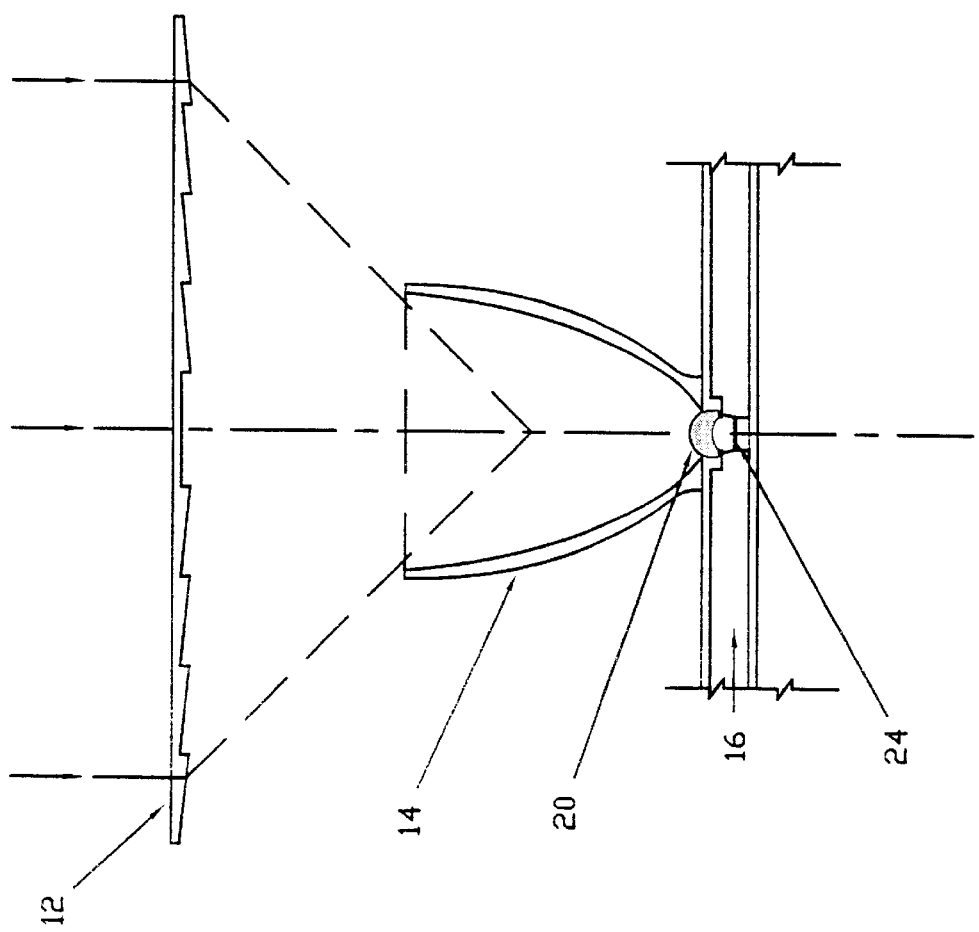
FIG. 2a shows the sunlight concentrator of FIG. 1b having a photovoltaic thin film multi-junction concentrator solar cell.
Figure 2B:
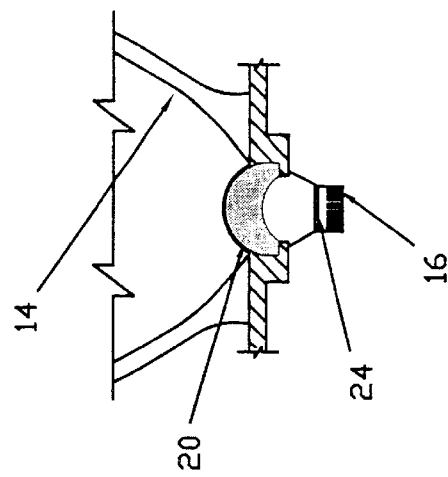
Figure 3B:
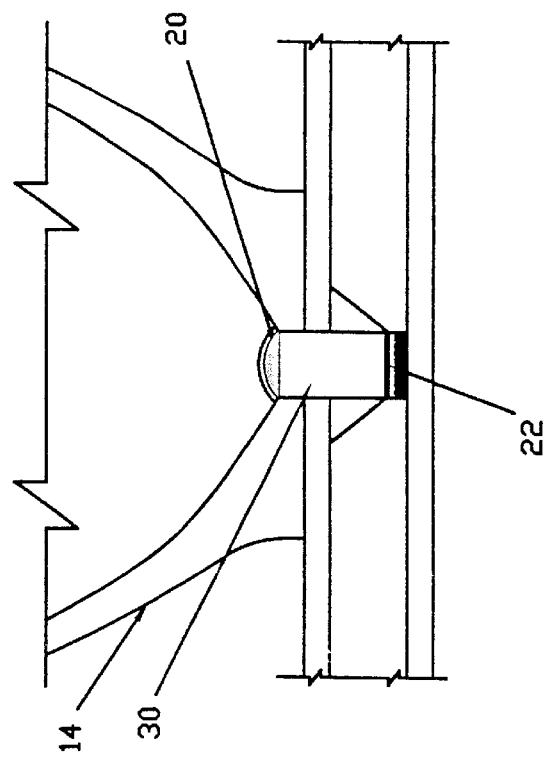
Figure 3A:
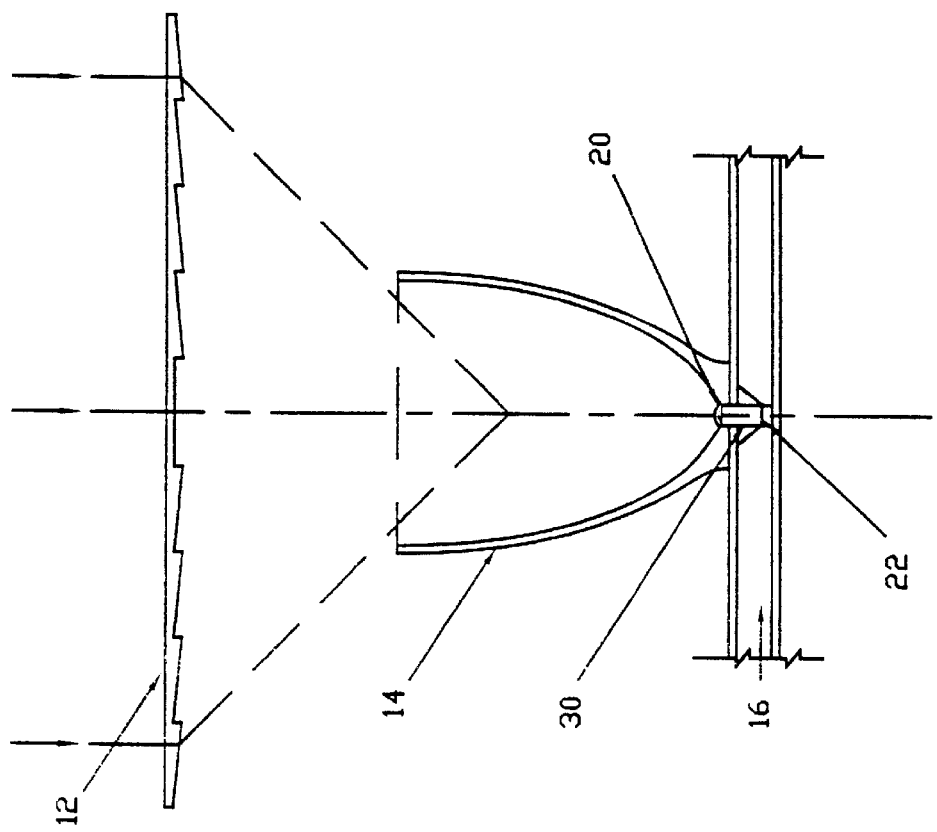
FIG. 3a shows another embodiment of a sunlight concentrator having an optical fiber and a photovoltaic concentrator cell.

In another embodiment shown in FIGS. 2a and 2b, solar cell 22 comprises a photovoltaic thin film multi-junction concentrator cell. In FIGS. 3a and 3b, sunlight concentrator 10 contains first optical concentrator 12, second optical concentrator 14, third optical concentrator 20 and an optical fiber 30. Photovoltaic concentrator cell 22 is disposed below optical fiber 30. In FIG. 3b, the third optical concentrator 20 is a glass lens with an anti-reflection coating, connected to an optical fiber 30 with diameter less than 3 mm above the high efficiency multi-junction concentrator solar cells 22 with a concentration rate of 500 times of normal sun rays.

The function of the device can be described as follows:

The focused sunlight from the first optical concentration 12 with the scope of the incoming sunrays passes through the wider opening aperture (upward opening) of the second optical concentration 14, namely the compound parabolic concentration (CPC). Hence, a margin around the circle of rays allows the maximum amount of sunlight possible to be concentrated even if the tracking mechanism does not function precisely and the parabolic concentration is not positioned perpendicularly to the sun. The focused sunlight is continuously reflected by the CPC mirror and is again refocused at the bottom of the CPC as a three-dimensional ring of light resembling a donut.

To further harmonize and concentrate the ring of light, three different shapes of solid glass lenses (one with optical fibers) may be used as the third optical concentrator 20.

First, as in FIG. 1c, the glass lens, situated at the bottom of the second optical concentrator 14, may have a bra-shaped cross-section. The cross section view of the focused light resembles two crab eyes located at both sides of the base of the cross section view of the CPC. The cross section of the glass lens is used to harmonize the ring of light and to concentrate that light to one thousand times that of normal incoming sunlight intensity after fresnel and CPC lenses. That light then impinges on the multi-junction concentrator solar cells. The bra-shaped lens is coated with an anti-reflective coating.

Second, as shown in FIG. 2b, where solar cells require fewer degrees of concentration, the crescent-shaped glass lens can be used as the third optical concentrator 20. This glass lens has a cross-section resembling a crescent. The lens has a convex, upward facing surface having a greater curvature than that of the concave, downward-facing surface. The lens is also coated with an anti-reflective coating.

Third, as shown in FIG. 3b, a half-sphere-shaped small pieced solid glass lens, which has convex upward-facing surface and a flat downward-facing surface, may be used. It is connected to a short length (less than three diameters, with D<3 mm) of optical fiber. At the bottom of the optical fiber, the focused light passes the fiber and impinges on the concentrator multi-junction solar cells 22. The lens is also coated with anti-reflective coating.

Accordingly, while only a few embodiments of the present invention have been shown and described, it is obvious that many changes and modifications may be made thereunto without departing from the spirit and scope of the invention.

What is claimed is:

1. A solar photovoltaic array module of an electric power generation system for residential homes comprising:
   a. a plurality of solar electric concentrators with three stages of optical concentration each solar electric concentrator comprising:
      i. a first optical concentrator, for focusing sun rays such that the rays are concentrated five to ten times their normal intensity;
      ii. a second optical concentrator having a bottom side and being disposed under said first optical concentrator for further concentration of the focused sun rays twenty to fifty times; and
      iii. a third optical concentrator, having an upward and downward facing surface, disposed at said bottom side of said second optical concentrator for further concentration of the focused sun rays; and
   b. a plurality of concentrator solar cells disposed below the third optical concentrators and having sets of fins disposed below each concentrator solar cell.

2. The system according to claim 1, wherein each first optical concentrator comprises a fresnel lens.

3. The system according to claim 1, wherein each second optical concentrator comprises a compound parabolic concentrator.

4. The system according to claim 3, wherein each compound parabolic concentrator is made of glass mirror.

5. The system according to claim 3, wherein each compound parabolic concentrator is made of ceramic.

6. The system according to claim 3, wherein each compound parabolic concentrator comprises a reflective coating surface and protective coatings.

7. The system according to claim 6, wherein said reflective coating surface is aluminum.

8. The system according to claim 6, wherein said reflective coating surface is chrome plated on metal plates.

9. The system according to claim 1, wherein each third optical concentrator comprises an optical concentrator glass lens.

10. The system according to claim 9, wherein each optical concentration glass lens has a bra-shaped cross section.

11. The system according to claim 9, wherein each optical concentrator glass lens has a convex upward facing surface and a concave downward facing surface of less curvature forming a crescent cross section.

12. The system according to claim 9, wherein each optical concentrator glass lens has a convex upward facing surface and a flat downward facing surface, connecting to an optical fiber.

13. The system according to claim 1, wherein said concentrator solar cells are selected from the group consisting of tandem GaInP/GaInAs cell, GaAs cell and at least three-junction solar cells.

14. The system according to claim 1, where said concentrator solar cells are selected from photovoltaic thin film multi-junction cells.

15. A solar photovoltaic array module of an electric power generation system for residential homes comprising:
   a. a plurality of solar electric concentrators with three stages of optical concentration each solar electric concentrator comprising:
      i. a fresnel lens for focusing sun rays such that the rays are concentrated five to ten times their normal intensity;
      ii. a compound parabolic concentrator having a bottom side and being disposed under said fresnel lens for further concentration of said focused sun rays twenty to fifty times; and
      iii. a convex solid glass lens and an optical fiber disposed at said bottom of the compound parabolic concentrator; and
   b. a plurality of concentrator solar cells disposed below said optical fibers, which have diameters less than three millimeters.

16. The system according to claim 15, wherein each compound parabolic concentrator is made of glass mirror.

17. The system according to claim 15, wherein each compound parabolic concentrator is made of ceramic.

18. The system according to claim 15, wherein each compound parabolic concentrator comprises a reflective coating surface and protective coatings.

19. The system according to claim 18, wherein said reflective coating surface is chrome plated on metal plates.

20. The system according to claim 15, wherein said concentrator solar cells are selected from the group consisting of tandem GaInP/GaInAs cell, GaAs cell, and at least three-junction solar cells.

* * * * *